United States Patent
Mendoza et al.

(10) Patent No.: US 6,748,344 B2
(45) Date of Patent: Jun. 8, 2004

(54) METHOD AND APPARATUS EMPLOYING A SCALING FACTOR FOR MEASURING AND DISPLAYING AN ELECTRICAL PARAMETER OF AN ELECTRICAL SYSTEM

(75) Inventors: Anthony C. Mendoza, Calgary (CA); Chi T. Ha, Calgary (CA); James Funke, Calgary (CA); Dalibor Kladar, Calgary (CA); Henryk J. Dabrowski, Calgary (CA); Mieczyslaw Bandura, Calgary (CA); Mahmoud Ghanem, Calgary (CA)

(73) Assignee: Eaton Corporation, Cleveland, OH (US)

( * ) Notice: Subject to any disclaimer, the term of this patent is extended or adjusted under 35 U.S.C. 154(b) by 112 days.

(21) Appl. No.: 10/134,994

(22) Filed: Apr. 29, 2002

(65) Prior Publication Data

US 2003/0204339 A1 Oct. 30, 2003

(51) Int. Cl.[7] .............................................. G06F 15/00
(52) U.S. Cl. ......................................... 702/189; 702/57
(58) Field of Search ....................... 73/1.01; 324/76.11, 324/615, 74; 702/57, 64, 86, 107, 108; 710/1

(56) References Cited

U.S. PATENT DOCUMENTS

| | | | | |
|---|---|---|---|---|
| 4,559,523 A | * | 12/1985 | Wakita | ........................ 341/156 |
| 4,933,631 A | | 6/1990 | Eccleston | |
| 4,999,628 A | * | 3/1991 | Kakubo et al. | .............. 341/139 |
| 5,012,181 A | * | 4/1991 | Eccleston | .................... 324/74 |
| 5,548,527 A | * | 8/1996 | Hemminger et al. | ........... 702/62 |
| 5,706,214 A | | 1/1998 | Putt et al. | |
| 6,084,394 A | | 7/2000 | Windsheimer et al. | |
| 6,320,525 B1 | | 11/2001 | Huang | |
| 6,369,744 B1 | * | 4/2002 | Chuang | ....................... 341/161 |

OTHER PUBLICATIONS

Carbone, P; Caciotta, M ("Distortionless Analog–to–Digital Conversion"; IEEE Instrumentation and Measurement Technology Conference ; May 19–21, 1997; pp 636–639.*

Guilherme, J; Vital, J; Franca, J; ("A True Logarithmic Analog–To–Digital Pipeline Converter With 1.5 Bit/Stage and Digital Correction"; IEEE International Conference on Electronics, Circuits and Systems; vol. 1; Sept 2–5, 2001; pp 393–396).*

Custodio, A; Bragos, R; Pallas–Areny, R; ("A Novel Sensor–Bridge–To–Microcontroller Interface"; IEEE Instrumentation and Measurement Technology Conference; May 21–23, 200; pp 892–895).*

* cited by examiner

*Primary Examiner*—John Barlow
*Assistant Examiner*—Douglas N Washburn
(74) *Attorney, Agent, or Firm*—Martin J. Moran (57) ABSTRACT

A meter includes an EEPROM storing a scaling factor; a divider providing a first analog voltage from an electrical system; an analog to digital converter (ADC) converting the first analog voltage to a first digital value; and a processor. The processor includes a first routine calculating the scaling factor; an input circuit for the first routine, and a second routine retrieving the scaling factor from the EEPROM and adding the scaling factor to the first digital value to provide a sum for a display. The first routine calculates the scaling factor by subtracting a second digital value from a larger third digital value, which represents a nominal voltage value. The second digital value is converted by the ADC from a second analog voltage from the divider, that receives a larger third analog voltage representing the nominal voltage value.

22 Claims, 6 Drawing Sheets

METHOD AND APPARATUS EMPLOYING A SCALING FACTOR FOR MEASURING AND DISPLAYING AN ELECTRICAL PARAMETER OF AN ELECTRICAL SYSTEM

BACKGROUND OF THE INVENTION

1. Field of the Invention

This invention relates to monitoring of electrical parameters and, more particularly, apparatus for measuring and displaying a voltage of an electrical system. The invention also relates to a method for measuring and displaying an electrical parameter of an electrical system.

2. Background Information

One common technique for measuring an alternating current (AC) voltage employs a voltage divider network including scaling resistors, which reduce the voltage and feed the same to a buffer amplifier. The output of the buffer amplifier is processed by an analog-to-digital converter (ADC) as controlled by a microcontroller, or by a microcontroller having a built-in ADC. Typically, the microcontroller drives an output display. The scaling resistors must have precise values or, else, must be suitably manually or automatically adjusted until the output display corresponds to the AC input voltage. Although very precise scaling resistors may be employed, such resistors are relatively expensive and do not address tolerances in other components such as, for example, amplifiers.

U.S. Pat. No. 4,933,631 discloses an amplifier circuit including an amplifier and digitally controlled resistors. The circuit is previously tested to determine calibration errors thereof as a function of amplitude and frequency. The calibration errors are stored in read-only memory of a microprocessor. The microprocessor responds to data signals from the memory as well as other data signals indicative of the amplitude and frequency of a monitored signal, in order to set the amplification factor of the circuit.

U.S. Pat. No. 6,084,394 discloses an electronic measuring device, which improves measurement accuracy by providing a correction factor stored in a correction element when the measuring device is first set up. The device includes an A/D converter, and a subsequent digital signal-processing device, such as a microcomputer and/or a digital signal processor. Signal processing is carried out with the aid of programs or program modules. The device also has a correction element. A first correction factor K1, which corresponds to a first stored reference value R1, is saved in a memory of the correction element. In addition, the correction factor K1 may already contain further multiplication factors or other factors for the purpose of (computational) simplification.

U.S. Pat. No. 6,320,525 discloses converting an offset voltage of an operational amplifier to a digital value using a calibration voltage. In turn, that digital value is subtracted from an actual converted voltage value, in order to eliminate the amplified offset voltage. The calibration voltage is equal to a reference voltage minus a voltage drop on two resistors.

State of the art metering devices, such as for use with electric power distribution systems, incorporate a microcomputer, which offers the opportunity for considerable functionality and flexibility in performing metering functions. Such metering apparatus typically monitors RMS and peak values of currents and voltages, power, energy, power factor, watts, VARs, K-factor, and in some cases, harmonic distortion.

Typically, such metering apparatus has a display on which the various parameters are presented, and a user interface through which the user can interact with the apparatus to select operating modes and conditions and request desired information. The microcomputer generates digital representations of the various parameters from analog input signals. These analog input signals, which represent current and voltage in the distribution system, are scaled down by input circuits to suitable input ranges (e.g., 0-20 ma; 0–10 volt) of the A/D converters of the meter.

It is known to calibrate such metering apparatus with a separate computer. A stable reference input to the meter to be calibrated and the output response of the meter are provided to the computer, which calculates a scaling factor. The scaling factor is then downloaded to the microcomputer of the meter. This is done for each of the inputs to the meter.

U.S. Pat. No. 5,706,214 discloses a meter/monitor, which receives an analog input signal as applied to an input resistor. An A/D converter reads the voltage across the resistor. A digital processor appropriately scales the digital signal corresponding to the analog input with two scaling factors: a zero scale factor which applies a dc offset, and a full-scale factor which in effect adjusts the slope of the conversion function. The digital processor reads the digital value of the analog signal generated by the A/D converter. The zero scale factor is subtracted and, then, the result is multiplied by the full-scale factor.

The meter/monitor also employs a sampling routine, which is initiated by a time interrupt to sample input currents, voltages and analog signals. The sample values are employed to calculate RMS values using stored scaling factors. Two scale factors are applied to the analog input signals: a zero scale factor or offset, and a full scale factor or slope.

For calibrating the monitor/meter, a source providing stable values of voltage and current is connected to input ranging circuits, and is also applied to a precision meter, which provides a reference value for the input parameters. For example, when current is selected for calibration, a screen lists all of the phase currents, IA, IB, IC, IN, and IG, the metered value of each of these currents, and the associated scale factor used to calculate the current from the stable value of current supplied by the source. The particular current to be calibrated is selected by soft switches. When one of the currents is selected, a new screen displays the metered values for all of the currents along with the scale factor for the selected current. Soft keys are employed to increment/decrement the digit values of the scale factor. As the scale factors change, the effects are shown by the real-time metered RMS value, which is displayed next to the scale factor. In calibrating the current, the user adjusts the scale factor up or down to make the metered RMS value shown next to the scale factor as close as possible to the reference value generated by the precision meter.

The meter/monitor also generates analog outputs. A digital processor routine appropriately scales the analog outputs. First, the routine normalizes the parameter value to be output as a 0 to a 100% analog signal. If the output signal is a 0-20 ma signal, then the normalized parameter value is multiplied by an analog output scale factor and is written to a D/A converter.

There is room for improvement in methods and apparatus for measuring and displaying an electrical parameter of an electrical system.

SUMMARY OF THE INVENTION

These needs and others are satisfied by the present invention, which obtains a scaling factor without requiring additional components. The scaling factor is determined by representing a nominal voltage value with a first digital value; providing a first analog voltage having a first magnitude, which represents the nominal voltage value; and providing a second analog voltage from the first analog voltage, with the second analog voltage having a second magnitude, which is less than the first magnitude of the first analog voltage. The second analog voltage is converted to a second digital value, which is less than the first digital value. The scaling factor is determined by subtracting the second digital value from the first digital value. Then, the scaling factor is stored in a non-volatile memory. Subsequently, analog voltages are determined from the electrical system voltage. Those analog voltages are converted to digital values. The scaling factor is retrieved from the non-volatile memory and is added to each of the digital values to provide a sum, which sum is displayed.

As one aspect of the invention, an apparatus for measuring and displaying an electrical parameter of an electrical system comprises: a non-volatile memory storing a scaling factor; a divider providing a first analog voltage having a first magnitude from the electrical parameter of the electrical system; an analog to digital converter circuit converting the first analog voltage to a first digital value; a processor comprising: a first routine calculating the scaling factor by subtracting a second digital value from a third digital value, the third digital value representing the nominal value of the electrical parameter of the electrical system, the second digital value being converted by the analog to digital converter circuit from a second analog voltage from the divider, the second analog voltage having a second magnitude, the divider receiving a third analog voltage having a third magnitude, which represents the nominal value, the second magnitude being less than the third magnitude, the second digital value being less than the third digital value, an input circuit for the first routine, and a second routine retrieving the scaling factor from the non-volatile memory and adding the scaling factor to the first digital value to provide a sum; and a display displaying the sum.

Preferably, the divider includes a plurality of scaling resistors, which divide the third analog voltage to provide the second analog voltage. The analog to digital converter circuit may include an analog to digital converter having a minimum digital output value and a maximum digital output value, which is greater than the third digital value, which is greater than the second digital value, which is greater than the minimum digital output value.

The analog to digital converter circuit may include a power supply having an output voltage. The electrical parameter may be a voltage. The scaling resistors may form a voltage divider network, which reduces the voltage of the electrical system to the first analog voltage having the first magnitude, in order that the first analog voltage is less than the output voltage of the power supply.

As another aspect of the invention, a method for measuring and displaying an electrical parameter of an electrical system comprises: representing a nominal value of the electrical parameter of the electrical system with a first digital value; providing a first analog voltage having a first magnitude, which represents the nominal value; providing a second analog voltage from the first analog voltage, the second analog voltage having a second magnitude, which is less than the first magnitude of the first analog voltage; converting the second analog voltage to a second digital value, which is less than the first digital value; determining a scaling factor by subtracting the second digital value from the first digital value; storing the scaling factor in a non-volatile memory; providing a third analog voltage from the electrical parameter of the electrical system; converting the third analog voltage to a third digital value; retrieving the scaling factor from the non-volatile memory; adding the scaling factor to the third digital value to provide a sum; and displaying the sum.

Preferably, the method further comprises employing a plurality of scaling resistors, which divide the first analog voltage to provide the second analog voltage; employing an analog to digital converter having a minimum digital output value and a maximum digital output value; and employing the maximum digital output value, which is greater than the first digital value, which is greater than the second digital value, which is greater than the minimum digital output value.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention has application generally to the measurement and display of voltages. The invention is described as applied to a single phase meter 12 or to a three-phase meter 26 for use, for example, with a 208 $V_{RMS}$ three-phase surge suppressor, although the invention is applicable to a wide range of AC or DC system electrical parameters, such as voltages (e.g., 240 $V_{RMS}$; 480 $V_{RMS}$), and any count of phases (e.g., one or more) for any measurement and display application.

Figure 1:
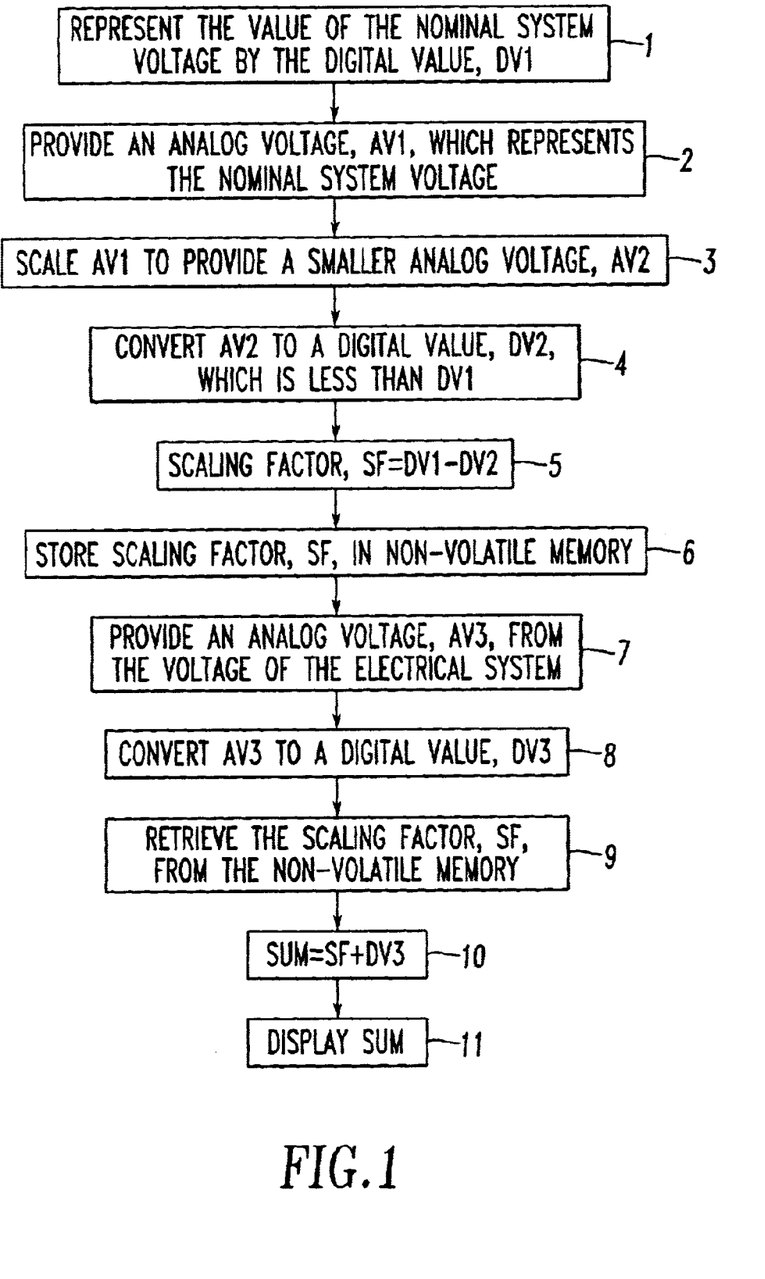
FIG. 1 is a block diagram of a measurement and display method in accordance with the present invention.

Referring to FIG. 1, a method for measuring and displaying a voltage of an electrical system is shown. First, at 1, the nominal value (e.g., 208 $V_{RMS}$) of the electrical system voltage is represented with a first digital value DV1. Next, at 2, a first analog voltage AV1 is provided having a first magnitude, which represents the nominal value of step 1. Then, at 3, a second analog voltage AV2 is provided (e.g., by a scaling resistor network) from the first analog voltage AV1. The second analog voltage AV2 has a second magnitude, which is less than the first magnitude of the first analog voltage AV1. Next, at 4, the second analog voltage AV2 is converted to a second digital value DV2, which is less than the first digital value DV1. At 5, a scaling factor SF is determined by subtracting the second digital value DV2 from the first digital value DV1. Next, at 6, the scaling factor SF is stored in a non-volatile memory. Then, at 7, a third analog voltage AV3 is provided from the voltage of the electrical system. Next, at 8, the third analog voltage AV3 is converted to a third digital value DV3. At 9, the scaling factor SF is retrieved from the non-volatile memory. Then, at 10, the scaling factor SF is added to the third digital value DV3 to provide a sum, SUM. Finally, at 11, the sum is displayed.

Figure 2:
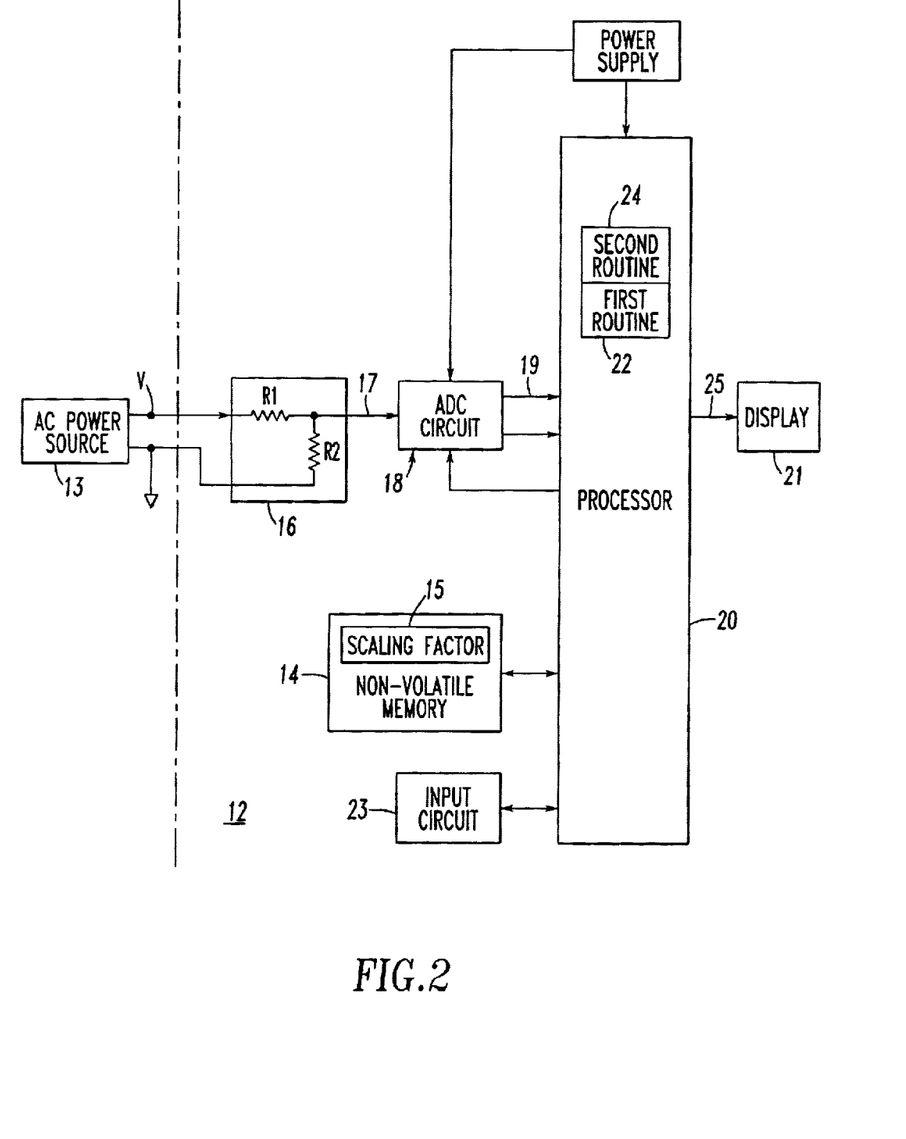
FIG. 2 is a block diagram of a measurement and display meter in accordance with the present invention.

FIG. 2 shows an apparatus, such as the exemplary meter 12, for measuring and displaying a voltage of an electrical system, such as an alternating current (AC) power source 13. The voltage (V) of the power source 13 has a nominal value (e.g., 208 $V_{RMS}$). The meter 12 includes a non-volatile memory (e.g., EEPROM 14) storing a scaling factor 15, a divider 16 providing a first analog voltage 17 having a first magnitude (e.g., about 190 $V_{RMS}$) from the voltage of the power source 13, an analog to digital converter (ADC) circuit 18 converting the first analog voltage 17 to a first digital value 19, a suitable processor 20, and a display 21. The processor 20 includes a first routine 22 (e.g., stored in local ROM memory (not shown)) for calculating the scaling factor 15, and an input circuit (e.g., keypad 23 for the first routine 22). The processor 20 also includes a second routine 24 for retrieving the scaling factor 15 from the non-volatile memory 14 and adding such scaling factor to the first digital value 19 to provide a sum 25. In turn, the sum 25 is displayed by the display 21.

As disclosed in greater detail, below, in connection with FIG. 4, the first routine 22 calculates the scaling factor 15 by subtracting a second digital value (e.g., 190) from a relatively larger third digital value (e.g., 208), which represents the nominal value of the voltage of the power source 13. The second digital value (e.g., 190) is converted by the ADC circuit 18 from a second analog voltage (e.g., 190 $V_{RMS}$) from the divider 16 (e.g., having a ratio of R2/(R1+R2)= 190/(190+18)=190/208). For example, during calibration by the first routine 22, the divider 16 may receive a third analog voltage (e.g., 208 $V_{RMS}$) from a precision voltage source (not shown), which voltage represents the nominal value of the voltage (V) of the power source 13. This example assumes, however, that the ADC circuit 18 may accommodate relatively high voltages.

Alternatively, scaling resistors, such as R1 and R2, are selected such that they provide a voltage, which is within the range of the ADC circuit 18 for the maximum input voltage (e.g., 230 $V_{RMS}$) to be employed by the meter 12. For example, if the maximum input voltage at 17 is 5 VDC or 5 $V_{RMS}$ for the ADC circuit 18, then the scaling resistors R1,R2 may be selected to give an output of 5 $V_{RMS}$ for a maximum input voltage V of 230 $V_{RMS}$.

As another example, the scaling resistors R1,R2 may be selected in order that the value of the converted RMS voltage (e.g., the digital value 19) is lower than the value of the nominal input voltage V (e.g., 208 $V_{RMS}$). In this example, the ADC circuit 18 may include a suitable buffer circuit, which converts a range of $AC_{RMS}$ voltages (e.g., 0 $V_{RMS}$ to about 279 $V_{RMS}$) to a corresponding range of DC voltages (e.g., 0 VDC to about 5 VDC). The ADC circuit 18 may also include a suitable 8-bit ADC, which has a corresponding range of digital values (e.g., 0 to 255). Here, the AC input voltages 0 $V_{RMS}$, 208 $V_{RMS}$ and about 279 $V_{RMS}$ correspond to the computed RMS digital values 0, 190 and 255, respectively. This example provides a positive value (e.g., 18) when the value of the computed RMS voltage (e.g., 190) is subtracted from the value of the nominal input voltage V (e.g., 208). Of course, this positive value will vary based upon the tolerances of the scaling resistors R1,R2 and the tolerances of the components of the ADC circuit 18.

Figure 3A:
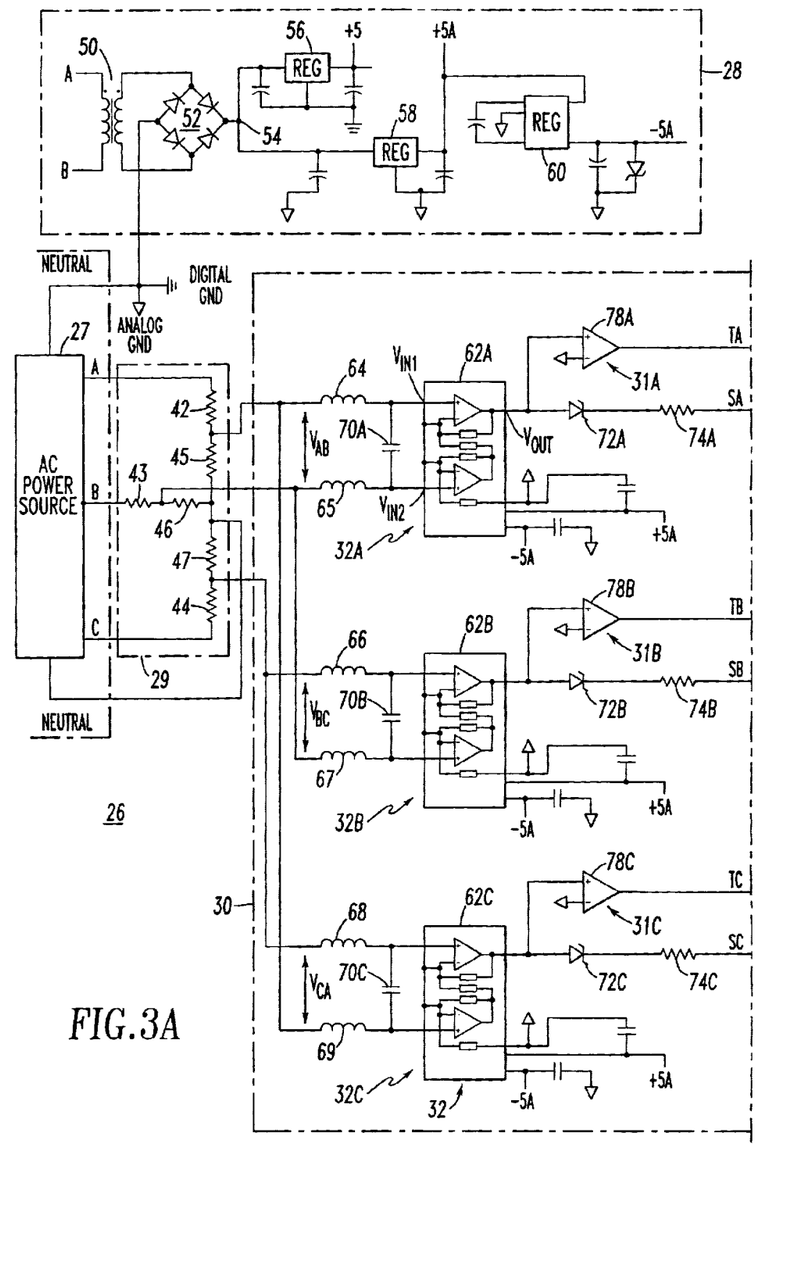
FIGS. 3A–3B are a block diagram in schematic form of a measurement and display meter in accordance with an embodiment of the present invention.
Figure 3B:
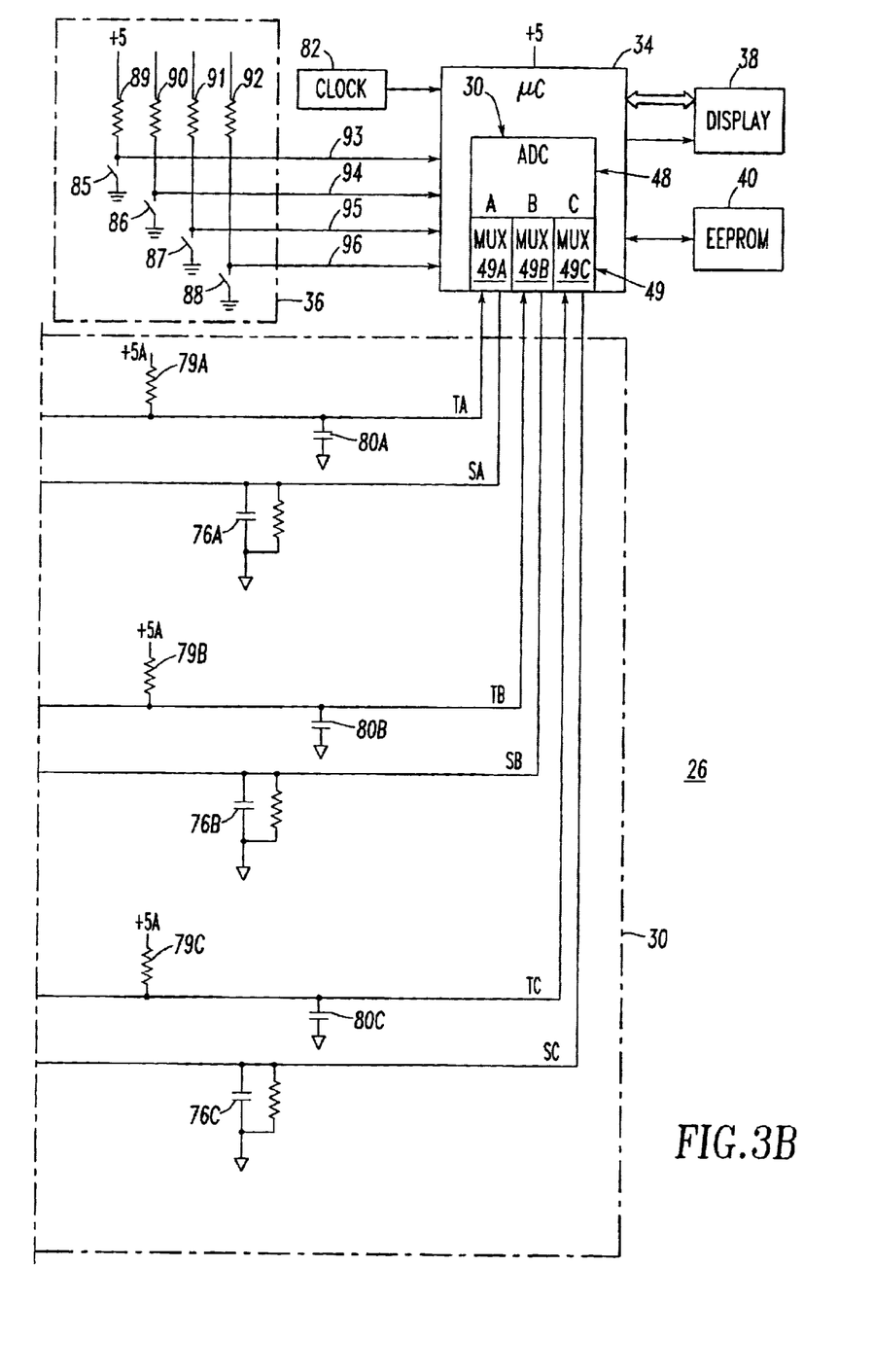

Referring to FIGS. 3A–3B, a meter 26 measures and displays the voltages of a three-phase (A,B,C) electrical system, such as alternating current (AC) power source 27 (e.g., three-phase Wye). The phase-to-phase voltages of the power source 27 have a nominal value (e.g., 208 $V_{RMS}$). The meter 26 includes a power supply 28, a scaling resistor network 29, and an ADC circuit 30 having a trigger circuit 31 and a buffer circuit 32 for the three phases. The meter 26 also includes a microcontroller 34, an input circuit such as keypad 36, an LCD display module 38, and an EEPROM 40. The exemplary microcontroller 34 is an 8-bit Microchip BIC16F74, although the invention is applicable to any suitable processor.

The AC power source 27 supplies power to the power supply 28 (from phases A,B) and to the scaling resistors of the scaling resistor network 29 (from phases A,B,C and neutral). The power supply 28 provides a suitable DC supply (e.g., +5, +5A and −5A) for the microcontroller 34 and the ADC circuit 30. The three-phase AC voltages of the AC power source 27 are reduced to three-phase voltages $V_{AB}$, $V_{BC}$, $V_{CA}$ by the scaling resistors 42,43,44,45,46,47 of the scaling resistor network 29, which form three voltage dividers 42-45, 43-46, 44-47 for input by the three buffer circuits 32A,32B,32C, respectively, of the buffer circuit 32. These buffer circuits match the analog input impedance of the multiplexer inputs 49A,49B,49C of the built-in A/D converter (ADC) 48 of the microcontroller 34 with the impedance formed by the scaling resistor network 29. The trigger circuits 31A,31B,31C start the sampling of the input AC voltages by initiating conversion of the analog voltages SA,SB,SC to corresponding digital values after the zero crossings of the three-phase voltages $V_{AB}$,$V_{BC}$,$V_{CA}$, respectively. The ADC 48 determines RMS values of the output of the respective buffer circuits 32A,32B,32C and the microcontroller 34 averages those values. Although the ADC 48 and multiplexer 49 are part of the microcontroller 34, one or more external ADCs may be employed. The EEPROM 40 provides non-volatile storage for three scaling factors associated with the corresponding three phases A,B,C.

The power supply 28 includes a step-down transformer 50 and a bridge rectifier 52, which supplies an unregulated DC voltage 54 to DC regulators (REGs) 56,58. The regulator 56 supplies +5 VDC to the digital portion of the meter 26, and the regulator 58 supplies +5 VDC (+5A) to the analog portion of such meter. The output of the regulator 58 is also connected to a regulator 60, which provides −5 VDC (−5A) for suitable instrumentation amplifiers 62A,62B,62C.

The scaling resistors 42,43,44,45,46,47 form voltage dividers, which reduce the AC power source three-phase voltages to suitable levels ($V_{AB}$,$V_{BC}$,$V_{CA}$) for the amplifiers 62A,62B,62C. Inductors 64,65,66,67,68,69 and capacitors 70A,70B,70C form three low pass filters for the inputs of the corresponding amplifiers 62A,62B,62C. In turn, these amplifiers provide differential outputs, each of which is based on the corresponding inputs (e.g., Vout=Vin1−Vin2). The amplifiers 62A,62B,62C also match the input impedance of microcontroller 34 with the impedance of the voltage dividers, in order to cancel common mode noise and provide buffering. The outputs of the amplifiers 62A,62B, 62C feed diodes 72A,72B,72C, respectively, which provide positive output voltages. This simplifies the calculations performed by the microcontroller 34. Resistors 74A,74B, 74C and capacitors 76A,76B,76C form three averaging circuits, which also reduce noise. The analog voltages SA,SB,SC of the three averaging circuits feed the microcontroller ADC multiplexer inputs 49A,49B,49C, respectively.

The trigger circuits 31A,31B,32C include comparators 78A,78B,78C, which provide square wave pulse trigger signals TA,TB,TC during the positive excursion or zero crossing of the outputs of the amplifiers 62A,62B,62C, respectively. These trigger signals are employed by the microcontroller 34 to initiate ADC sampling. Resistors 79A,79B,79C and respective capacitors 80A,80B,80C at the comparator outputs provide a suitable RC time constant, which prevents false triggering of the microcontroller 34.

A suitable time base source 82 provides the timing input of the microcontroller 34, which calculates the RMS values of the three-phase voltages and drives a suitable display, such as the exemplary two-row by 16-character LCD display module 38.

The microprocessor keypad 36 includes buttons (e.g., switches) 85,86,87,88, pull-up resistors 89,90,91,92 and outputs 93,94,95,96, which initiate a reset function, an auto-calibration process, an increment request, and a decrement request, respectively, through corresponding microprocessor inputs.

The reference voltage of the microcontroller ADC 48 is its supply voltage (e.g., +5). The regulators 56,58 provide suitably stable +5 VDC references. With a maximum input of +5 VDC on the analog inputs of the ADC multiplexer inputs 49A,49B,49C, the exemplary 8-bit ADC output is 255 (i.e., 'FF'H). The scaling resistors 42,43,44,45,46,47 are selected such that the initial RMS calculation by the microcontroller 34 provides an RMS result value, which value is lower than the actual value of the voltage being measured. Also, such scaling resistors are selected in order that their corresponding output voltages do not exceed the microcomputer ADC reference voltage for the maximum expected output voltage of the AC power source 27. This selection of the resistance of the scaling resistors 42,43,44,45,46,47 is predetermined (e.g., in the circuit design phase of the meter 26) and does not change (e.g., in the product manufacturing phase). Instead, the auto-calibration process discussed, below, addresses the tolerances of these resistor values and other components (e.g., the offset voltages of the amplifiers 62A,62B,62C).

For example, for a 208 $V_{RMS}$ AC power source 27, the scaling resistors 42,43,44,45,46,47 are selected such that the initial RMS calculation by the microcomputer 34 provides a result value, which is less than the value of 208 $V_{RMS}$. For example, such scaling resistors may be selected such that the initial RMS calculated value is about 190 $V_{RMS}$ (i.e., about 'BE'H) By coincidence, this may also be the value of the digital output of the exemplary 8-bit ADC 48, although the invention is applicable to calculated RMS values, which are different than the ADC output (e.g., each count or least significant bit of the ADC output may represent less than or greater than 1 VDC or $V_{RMS}$). At this point, the microcontroller 34 checks if any scaling factor data is stored in the EEPROM 40. If there is no stored data, then the auto-calibration is started. Alternatively, auto-calibration may be initiated by depressing button 86.

For auto-calibration, the AC power source 27 may be a three-phase auto-transformer that is adjusted until a suitable voltage is achieved. The meter 26 is connected to the output of such transformer to start the auto-calibration. Since the actual three-phase voltages may be different than the nominal values of those voltages (e.g., if the auto-calibration is employed in the field), the buttons 87,88 may be employed to increment and decrement the nominal values.

As a further example for the three-phase system, with an input of 208 $V_{RMS}$, the calculated RMS voltages may be: $V_{AB}$=190 $V_{RMS}$; $V_{BC}$=192 $V_{RMS}$; and $V_{CA}$=191 $V_{RMS}$. In this example, the scaling factors for phases A, B and C are: 208−190 =18, 208−192=16, and 208−191=17, respectively, which values are stored in EEPROM 40. In turn, for each of the three-phase voltages, the microcomputer 34 adds the corresponding scaling factor to the initially calculated RMS voltage and outputs the sum to the display 38.

Figure 4:
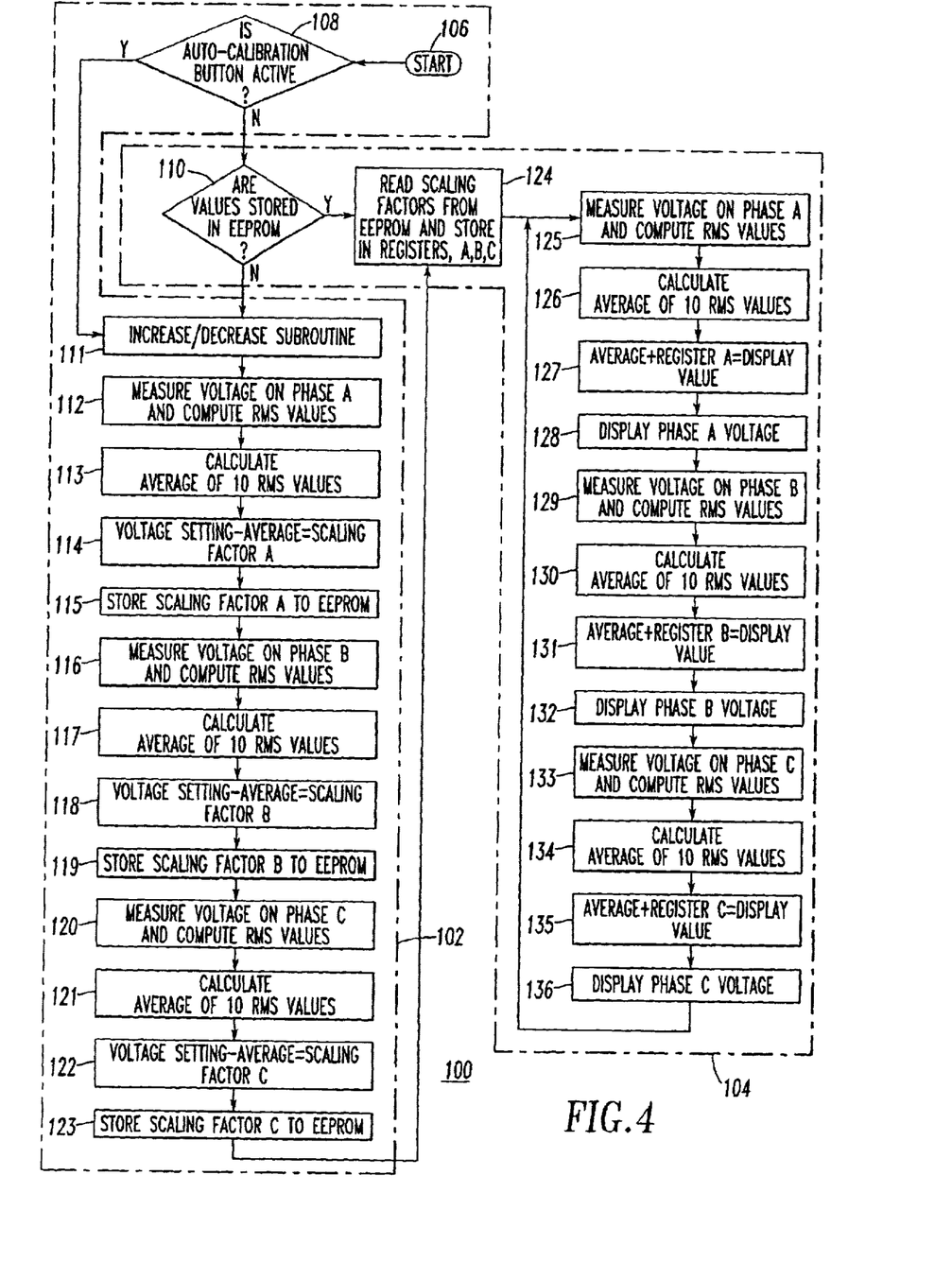
FIG. 4 is a flow chart of a routine executed by the microcontroller of FIG. 3B to determine a scaling factor in accordance with the present invention.
Figure 5:
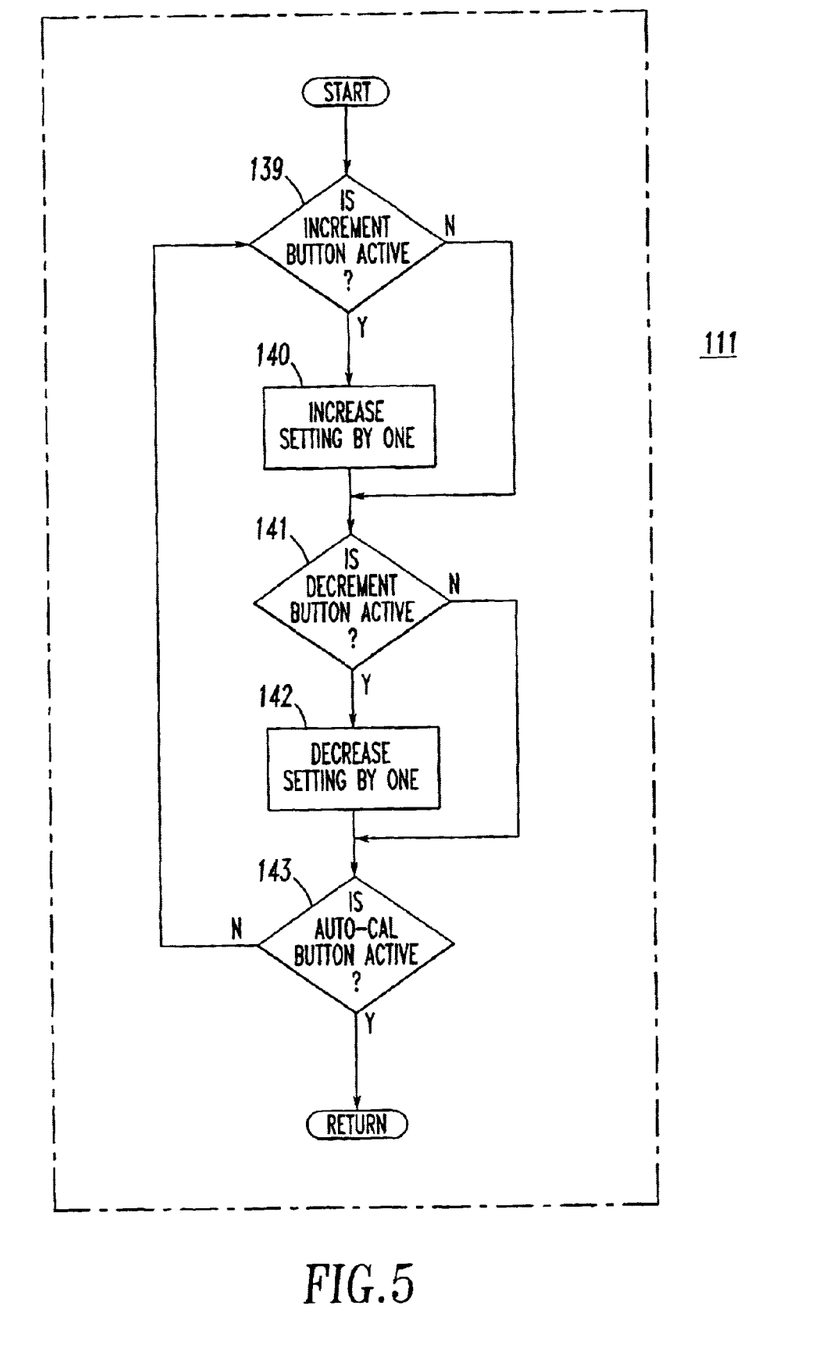
FIG. 5 is a flow chart of the increase/decrease subroutine of FIG. 4.

FIG. 4 shows a routine 100 for getting the scaling factors and displaying the voltages. The routine 100 has two parts: (1) an auto-calibration portion 102; and (2) a conversion and display portion 104. After starting at 106, at 108, the microcontroller 34 determines if the auto-calibration button 86 is active (e.g., pressed). If not, then at 110, the microcontroller 34 determines if there are values (e.g., a flag value; non-zero values) stored in the EEPROM 40. If so, then auto-calibration has already been performed and execution resumes at 124. Otherwise, if there are no stored values in EEPROM 40 or if the button 86 is pressed, then the increase/decrease subroutine 111 of FIG. 5 is executed.

After the subroutine 111, at 112, upon receiving a positive pulse from the signal TA from comparator 78A, the microcontroller 34 measures and calculates the corresponding RMS voltage SA for a plurality of cycles. Next, at 113, the calculated RMS voltages are summed over a plurality (e.g., ten) cycles and the average is calculated. Steps 112 and 113 successively convert the analog voltage SA (e.g., 208 $V_{RMS}$ from an auto-transformer as reduced by the scaling resistor network 29 and as buffered by amplifier 62A) to a plurality of corresponding digital values, and average the corresponding digital values to provide an average value. The average of a plurality (e.g., ten) RMS values is computed to take care of voltage variation or fluctuation, although the invention is applicable to any suitable count (e.g., one or more) of RMS values.

At 114, the average value is subtracted from the nominal value (e.g. 208 $V_{RMS}$ from an auto-transformer). The result is the scaling factor for phase A (i.e., voltage $V_{AB}$), which is stored in the EEPROM 40 at 115. The steps 112-115 for phase A are repeated at steps 116-119 for phase B (i.e., voltage $V_{BC}$) and steps 120-123 for phase C (i.e., voltage $V_{CA}$), in order to obtain and store the scaling factors for phases B and C at 119 and 123, respectively. Although three-phase voltages are disclosed, the invention is applicable to any number of phases (e.g., one or more; split phase) and any type of value (e.g., voltage, current). In the exemplary embodiment, the averaging at steps 113,117,121 cancels voltage fluctuations that might cause erroneous readings.

The exemplary algorithm calibrates the meter 26 to address the tolerances of the scaling resistor network 29, the buffer circuit 32 and the ADC 48. By employing this method, no additional calibration circuit is required. After calibration, the meter 26 measures the scaled AC input voltages, gets the average RMS values and adds the scaling factors. The sums are then displayed on the display 38. In particular, if there are values (e.g., non-zero) in the EEPROM 40 at 110, or after 123, the microcontroller 34 reads the stored scaling factors from the EEPROM 40, at 124, and preferably stores the same in local memory or registers (not shown) of the microcontroller 34. Using such memory or registers increases speed as opposed to periodic access of the EEPROM 40. Next, at 125 and 126, the RMS values for phase A are computed and averaged (e.g., for ten readings), respectively, although such averaging and step 126 need not be employed. Steps 125 and 126 successively convert the analog voltage SA (e.g., 208 $V_{RMS}$ from AC power source 27 as reduced by the scaling resistor network 29 and as buffered by amplifier 62A) to a plurality of corresponding digital values, and average the corresponding digital values to provide an average value. Preferably, such averaging prevents rapid change of the displayed voltage. The average of a plurality (e.g., ten) RMS values is computed to take care of voltage variation or fluctuation, although the invention is applicable to any suitable count (e.g., one or more) of RMS values.

Next, at 127, the average is added to the scaling factor of register A for phase A. Then, at 128, the resulting voltage value is displayed on the display 38. The steps 125–128 for phase A are repeated at steps 129–132 for phase B (analog voltage SB) and steps 133-136 for phase C (analog voltage SC), in order to measure, average, adjust and display the voltages for phases B and C at 132 and 136, respectively.

As shown in the subroutine 111 of FIG. 5, the operator or user has the option of increasing or decreasing the nominal value of 208 $V_{RMS}$. This is useful in the field where the actual voltage may be different from the nominal voltage. At 139, if the button 87 is pressed, then the nominal value is incremented by one, at 140. Otherwise, if the button 87 is not pressed or after 140, then it is determined if the button 88 is pressed. If so, then the nominal value is decremented by one, at 142. Otherwise, if the button 88 is not pressed or after 142, then it is determined if the button 86 is pressed. If no, then step 139 is repeated. On the other hand, if the button 86 is pressed, then the subroutine 111 returns to step 112.

In production, the nominal voltage, which the meter 26 is to measure, may be suitably set through the use of, for example, an auto-transformer (not shown) or a regulated AC supply (not shown) in place of the power source 27. However, the value of the nominal voltage is not critical and any suitable value may be employed. Similarly, in the field, if the voltage is not equal to the desired nominal voltage, then through the buttons 87,88, the operator may increase or decrease the nominal value until it corresponds to the reading of a suitable voltmeter (not shown), which connected to the auto-transformer. Normally, however, once the meter 26 is calibrated in the factory, it does not need further recalibration in the field.

The exemplary electric meters 12,26 perform auto-calibration when first started up. A suitable nominal analog voltage is applied to its input and the microcontrollers 20,34 and ADC circuits 18,30 measure and compute the RMS voltage for each AC cycle and the average for multiple AC cycles. The average is subtracted from the nominal value to obtain the scaling factor, which is stored in the EEPROMs 14,40. The meters are now ready to display the voltage being measured on the displays 21,38 by adding the scaling factor to the computed RMS value. The scaling factor accommodates the tolerance of the scaling resistor networks 16,29 and other components that might otherwise cause errors in the reading. This method avoids the requirement for manually adjusting a potentiometer and permits optional calibration in the field without the need for any special equipment.

While for clarity of disclosure reference has been made herein to the exemplary displays 21,38 for displaying calculated RMS values, it will be appreciated that these and other values may be stored, printed on hard copy, be computer modified, or be combined with other data. All such processing shall be deemed to fall within the terms "display" or "displaying" as employed herein.

Although a method and apparatus for measuring and displaying a voltage is disclosed, the invention is applicable to the measurement and display of other electrical parameters (e.g., without limitation, current) which are converted to a voltage.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An apparatus for measuring and displaying an electrical parameter of an electrical system, said electrical parameter having a nominal value, said apparatus comprising:

a non-volatile memory storing a scaling factor;

a divider providing a first analog voltage from said electrical parameter of said electrical system, said first analog voltage having a first magnitude;

an analog to digital converter circuit converting said first analog voltage to a first digital value;

a processor comprising:

a first routine calculating said scaling factor by subtracting a second digital value from a third digital value, said third digital value representing said nominal value, said second digital value being converted by said analog to digital converter circuit from a second analog voltage from said divider, said second analog voltage having a second magnitude, said divider receiving a third analog voltage having a third magnitude, which represents said nominal value, said second magnitude being less than said third magnitude, said second digital value being less than said third digital value, an input circuit for said first routine, and a second routine retrieving said scaling factor from said non-volatile memory and adding said scaling factor to said first digital value to provide a sum; and a display displaying said sum.

2. The apparatus of claim 1 wherein said divider includes a plurality of scaling resistors, which divide said third analog voltage to provide said second analog voltage; wherein said analog to digital converter circuit includes an analog to digital converter having a minimum digital output value and a maximum digital output value; and wherein said maximum digital output value is greater than said third digital value, which is greater than said second digital value, which is greater than said minimum digital output value.

3. The apparatus of claim 2 wherein said first digital value is less than said sum.

4. The apparatus of claim 1 wherein said analog to digital converter circuit includes an analog to digital converter having an analog input and a buffer electrically connected between said divider and said analog input.

5. The apparatus of claim 1 wherein the input circuit of said processor includes means for initiating the first routine.

6. The apparatus of claim 5 wherein said means for initiating the first routine is a button.

7. The apparatus of claim 1 wherein the input circuit of said processor includes means for selecting said third digital value.

8. The apparatus of claim 7 wherein said means for selecting said third digital value includes a pair of buttons.

9. The apparatus of claim 1 wherein said electrical parameter of said electrical system is an alternating current voltage having a zero crossing; and wherein said analog to digital converter circuit includes a trigger circuit initiating conversion of said first analog voltage to said first digital value after said zero crossing.

10. The apparatus of claim 1 wherein said display displays said third digital value responsive to said first routine.

11. The apparatus of claim 1 wherein said electrical parameter is a voltage of said electrical system; wherein said analog to digital converter circuit includes a power supply having an output voltage; and wherein said divider includes a plurality of scaling resistors, which reduce said voltage of said electrical system to said first analog voltage having said first magnitude, in order that said first analog voltage is less than the output voltage of said power supply.

12. The apparatus of claim 1 wherein said first digital value is less than said third digital value.

13. A method for measuring and displaying an electrical parameter of an electrical system, said electrical parameter having a nominal value, said method comprising:

representing said nominal value with a first digital value;

providing a first analog voltage having a first magnitude, which represents said nominal value;

providing a second analog voltage from said first analog voltage, said second analog voltage having a second magnitude, which is less than the first magnitude of said first analog voltage;

converting said second analog voltage to a second digital value, which is less than said first digital value;

determining a scaling factor by subtracting said second digital value from said first digital value;

storing said scaling factor in a non-volatile memory;

providing a third analog voltage from said electrical parameter of said electrical system;

converting said third analog voltage to a third digital value;

retrieving said scaling factor from said non-volatile memory;

adding said scaling factor to the third digital value to provide a sum; and displaying said sum.

14. The method of claim 13 further comprising employing a plurality of scaling resistors, which divide said first analog voltage to provide said second analog voltage;

employing an analog to digital converter having a minimum digital output value and a maximum digital output value; and employing said maximum digital output value, which is greater than said first digital value, which is greater than said second digital value, which is greater than said minimum digital output value.

15. The method of claim 13 further comprising employing a voltage as said electrical parameter of said electrical system; and employing a plurality of scaling resistors to divide said voltage of said electrical system to provide said third analog voltage.

16. The method of claim 13 further comprising employing a positive value of said scaling factor.

17. The method of claim 13 further comprising retrieving said scaling factor from the non-volatile memory; and determining that said scaling factor is zero and responsively performing said steps of:

representing said nominal value with a first digital value, providing a first analog voltage having a first magnitude, which represents said nominal value, providing a second analog voltage from said first analog voltage, said second analog voltage having a second magnitude, which is less than the first magnitude of said first analog voltage, converting said second analog voltage to a second digital value, which is less than said first digital value, and determining a scaling factor by subtracting said second digital value from said first digital value.

18. The method of claim 13 further comprising engaging a button and responsively determining said scaling factor.

19. The method of claim 13 further comprising employing a keypad to select said first digital value.

20. The method of claim 13 further comprising displaying said sum, which is greater than said first digital value.

21. The method of claim 13 further comprising successively converting said second analog voltage to a plurality of corresponding digital values; and averaging said corresponding digital values to provide said second digital value.

22. The method of claim 13 further comprising successively converting said third analog voltage to a plurality of corresponding digital values; and averaging said corresponding digital values to provide said third digital value.

\* \* \* \* \*